(12) United States Patent
Sim et al.

(10) Patent No.: US 11,493,845 B2
(45) Date of Patent: Nov. 8, 2022

(54) ORGANIC BOTTOM ANTIREFLECTIVE COATING COMPOSITION FOR NANOLITHOGRAPHY

(71) Applicant: Rohm and Haas Electronic Materials Korea Ltd., Chungcheongnam-do (KR)

(72) Inventors: Jae Hwan Sim, Gyeonggi-do (KR); So-Yeon Kim, Gyeonggi-do (KR); Jung Kyu Jo, Gyeonggi (KR); Hye-Won Lee, Gyeonggi-do (KR); Jihoon Kang, Gyeonggi-do (KR); Jae-Bong Lim, Chungcheongnam-do (KR); Jun-Han Yun, Gyeonggi-do (KR)

(73) Assignee: ROHM AND HAAS ELECTRONIC MATERIALS KOREA LTD., Chungcheongnam-Do (KR)

( * ) Notice: Subject to any disclaimer, the term of this patent is extended or adjusted under 35 U.S.C. 154(b) by 0 days.

(21) Appl. No.: 14/584,995

(22) Filed: Dec. 29, 2014

(65) Prior Publication Data

US 2015/0185614 A1    Jul. 2, 2015

(51) Int. Cl.
*G03F 7/09* (2006.01)
*C09D 5/00* (2006.01)
*C09D 179/08* (2006.01)

(52) U.S. Cl.
CPC .............. *G03F 7/091* (2013.01); *C09D 5/006* (2013.01); *C09D 179/08* (2013.01)

(58) Field of Classification Search
CPC ......... G03F 7/091; G03F 7/094; C09D 5/006; C09D 179/08
USPC ....................................................... 430/271.1
See application file for complete search history.

(56) References Cited

U.S. PATENT DOCUMENTS

| | | | |
|---|---|---|---|
| 3,707,584 A * | 12/1972 | Tulacs | C09D 5/4484 204/493 |
| 5,851,730 A | 12/1998 | Thackeray et al. | |
| 5,851,738 A | 12/1998 | Thackeray et al. | |
| 5,886,102 A | 3/1999 | Sinta et al. | |
| 5,939,236 A | 8/1999 | Pavelcheck et al. | |
| 6,187,506 B1 | 2/2001 | Ding et al. | |
| 6,852,421 B2 | 2/2005 | Wayton et al. | |
| 7,163,751 B2 | 1/2007 | Wayton et al. | |
| 7,691,556 B2 | 4/2010 | Wu et al. | |
| 7,790,356 B2 | 9/2010 | Kishioka et al. | |
| 8,501,383 B2 | 8/2013 | Zampini et al. | |
| 8,551,686 B2 | 10/2013 | Yao et al. | |
| 10,307,752 B2 | 6/2019 | Tsuchiya et al. | |
| 2007/0099108 A1* | 5/2007 | Abdallah et al. | G03F 7/091 430/270.1 |
| 2009/0035704 A1 | 2/2009 | Zhuang et al. | |
| 2009/0042133 A1 | 2/2009 | Kiang et al. | |
| 2010/0092894 A1 | 4/2010 | Liu et al. | |
| 2011/0033800 A1 | 2/2011 | Zampini et al. | |
| 2011/0033801 A1 | 2/2011 | Zampini et al. | |
| 2011/0104613 A1* | 5/2011 | Yao et al. | G03F 7/091 430/280.1 |
| 2014/0038109 A1* | 2/2014 | Rahman et al. | G03F 7/094 430/319 |
| 2014/0295349 A1* | 10/2014 | Yao | G03F 7/30 430/325 |

FOREIGN PATENT DOCUMENTS

| | | |
|---|---|---|
| CN | 1704455 A | 12/2005 |
| CN | 101296952 A | 10/2008 |
| CN | 101796150 A | 8/2010 |
| CN | 102187279 A | 9/2011 |
| CN | 102575127 A | 7/2012 |
| EP | 1598702 A1 | 11/2005 |
| KR | 20070007911 A | 1/2007 |
| KR | 20070051363 A | 5/2007 |
| KR | 20100066503 A | 6/2010 |
| KR | 20100125196 A | 11/2010 |
| TW | 281941 B | 6/2007 |
| WO | 2014002994 A1 | 1/2014 |

OTHER PUBLICATIONS

English Language Summary of Examination Report issued in counterpart Taiwan Application No. 103146502, dated Feb. 26, 2016 (4 Pages).

* cited by examiner

*Primary Examiner* — Duane Smith
*Assistant Examiner* — Nicholas E Brown
(74) *Attorney, Agent, or Firm* — Cantor Colburn LLP

(57) ABSTRACT

An anti-reflective coating composition is provided. The anti-reflective coating composition of the present invention can be useful in preventing a pull-back phenomenon in which an anti-reflective coating layer tears on a corner of a pattern of a substrate during a heat curing process and improving gap-filling performance of the pattern since a crosslinker is attached to a polymer in the composition and the content of the low-molecular-weight crosslinker in the composition is minimized to regulate a heat curing initiation temperature.

10 Claims, 3 Drawing Sheets

ORGANIC BOTTOM ANTIREFLECTIVE COATING COMPOSITION FOR NANOLITHOGRAPHY

FIELD OF THE INVENTION

The present invention relates to an anti-reflective coating composition (ARC) capable of being used to be coated between a substrate and a photoresist composition layer in a photolithographic process.

BACKGROUND OF THE INVENTION

A photoresist is a photosensitive composition which is used to transfer an image to a substrate. A coating layer of the photoresist is formed on the substrate, and then exposed to actinic radiation through a photomask. The photomask has regions which are opaque and transparent to actinic radiation. When the photoresist coating layer is exposed to the actinic radiation, light-inducible chemical modification occurs on the photoresist coating layer. As a result, a pattern of the photomask is transferred to the photoresist coating layer. Thereafter, the photoresist coating layer is developed to form a patterned image to be capable of being selectively treated on a substrate.

The photoresist may be positive or negative for the actinic radiation. In the case of most negative photoresists, polymerization or crosslinking occurs in a region exposed to the actinic radiation by a reaction between a polymerizable compound and a photoactive compound in a photoresist composition. As a result, the exposed region is dissolved less by a developer than an unexposed region. On the other hand, in the case of positive photoresists, an exposed region is more easily dissolved by a developer, and an unexposed region is dissolved relatively less by the developer.

Generally, photoresists are used to manufacture semiconductors in which semiconductor wafers such as Si or GaAs are converted into a composite matrix of an electronic conduction path (preferably micron or submicron geometry) for performing circuit functions. To achieve such objects, it is important to properly treat the photoresist. Several operations used to treat the photoresist act interdependently, but one of the most important operations to obtain a high-resolution photoresist image is a light exposure operation.

In such a light exposure operation, when the actinic radiation radiated to the photoresist coating layer is reflected, resolution of the image patterned on the photoresist coating layer may be degraded. For example, when the actinic radiation is reflected on an interface between the substrate and the photoresist, a spatial variation in intensity of the actinic radiation radiated to the photoresist coating layer is caused, and the actinic radiation is scattered toward an unintended photoresist region, resulting in a change or a lack of uniformity in line width of the pattern upon development. Also, since there are differences in quantities of scattered or reflected actinic radiation between the regions, the line width may become less uniform, for example, the resolution may be restricted according to topography of the substrate.

To solve the reflection-related problems as described above, a light absorption layer, that is, an anti-reflective coating layer, is used between a surface of the substrate and the photoresist coating layer (see U.S. Pat. Nos. 5,939,236, 5,886,102, 5,851,738, 5,851,730, etc.).

However, such a conventional anti-reflective coating layer often has problems in that a pull-back phenomenon in which the anti-reflective coating layer tears on an edge of the pattern during a curing process may occur when the coating layer is coated on the substrate having the pattern formed therein, or a gap-filling property of the pattern may be poor when the pattern which has been formed on the substrate has a high resolution and aspect ratio.

SUMMARY OF THE INVENTION

Therefore, the present invention is designed to solve the problems of the prior art, and therefore it is an object of the present invention to provide a novel anti-reflective coating composition capable of solving a problem regarding qualities of an anti-reflective coating layer which may be caused when the anti-reflective coating layer is formed on a substrate having a pattern formed therein.

According to an aspect of the present invention, there is provided an anti-reflective coating composition, which comprises: (a) a polymer comprising (a-1) at least one unit derived from a compound having an aromatic group and constituting the main chain of the polymer; and (a-2) a unit derived from a crosslinker and attached to the main chain; and (b) a solvent, wherein the content of the crosslinker that has not attached to the main chain of the polymer is greater than 0 wt % and less than or equal to 5 wt % based on the total weight of solid content in the composition.

According to another aspect of the present invention, there is provided a method of forming a photolithographic pattern, comprising: (a) providing a substrate comprising one or more layers to be patterned over a surface of the substrate; (b) forming an anti-reflective coating layer from the anti-reflective coating composition over the one or more layers to be patterned; (c) applying a layer of a photoresist composition over the anti-reflective coating layer; (d) exposing the photoresist composition layer to actinic radiation through a mask pattern; and (e) applying a developer to the photoresist composition layer to remove a portion of the photoresist layer to form a photoresist pattern.

The anti-reflective coating composition according to one exemplary embodiment of the present invention can be useful in preventing a pull-back phenomenon in which an anti-reflective coating layer tears on a corner of a pattern of a substrate and improving gap-filling performance of the pattern since a crosslinker is attached to a polymer in the composition and the content of the low-molecular-weight crosslinker in the composition is minimized to regulate a heat curing initiation temperature.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF THE INVENTION

Figure 1A:
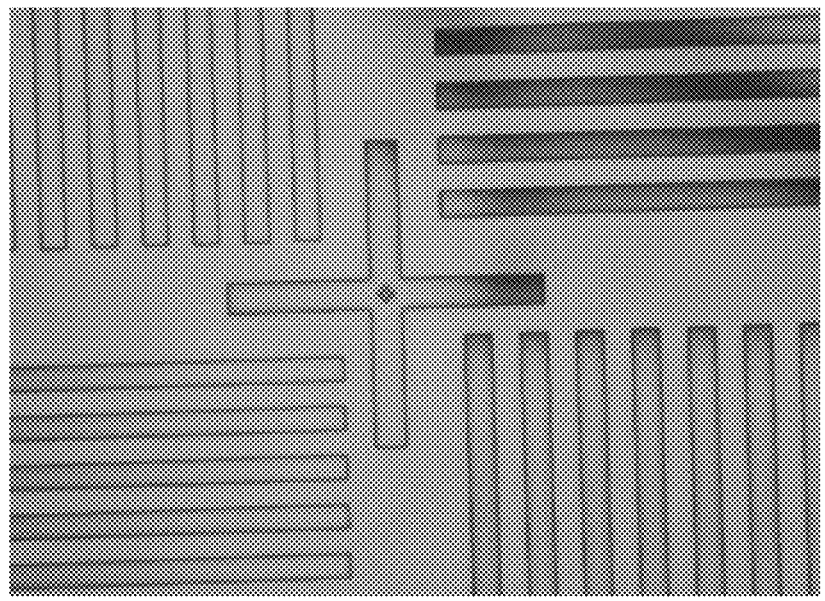
FIGS. 1A and 1B are microscope images of films obtained by coating patterns with compositions of Example 2 and Comparative Example 2, respectively, and curing the compositions.

Exemplary Embodiments of the Present Invention Will be Described in Detail Below.

Anti-Reflective Coating Composition

The anti-reflective coating composition according to one exemplary embodiment of the present invention is a composition including (a) a polymer including (a-1) at least one unit derived from a compound having an aromatic group and constituting the main chain of the polymer, and (a-2) a unit derived from a crosslinker and attached to the main chain, and (b) a solvent.

The anti-reflective coating composition may be prepared using a method that includes (1) polymerizing a source monomer including a compound containing aromatic groups, (2) reacting a crosslinker with the prepared polymer to attach the crosslinker to the main chain of a polymer, and (3) mixing an acid compound and/or an acid generator with the polymer to which the crosslinker is attached.

The content of the residual crosslinker which is not attached to the main chain of the polymer in the anti-reflective coating composition may be greater than 0 wt % and less than or equal to 5 wt %, more preferably greater than 0 wt % and less than or equal to 3 wt %, based on the total weight of solid content in the composition.

In this specification, the term "residual crosslinker" in the composition refers to a crosslinker which is blended with the other components in the composition in a state in which the crosslinker is not attached or grafted to another polymer in the composition.

As described above, the anti-reflective coating composition according to one exemplary embodiment of the present invention includes a polymer to which the crosslinker is attached or grafted, and thus may minimize the content of the low-molecular-weight crosslinker in the composition, thereby preventing a pull-back phenomenon in which an anti-reflective coating layer tears on a corner of a pattern of the substrate during a heat curing process. Also, the anti-reflective coating composition may regulate a starting point for a crosslinking reaction, unlike a conventional anti-reflective coating composition in which a crosslinker is simply blended. Further, the anti-reflective coating composition may form an insoluble network only by heat curing without using an additional acid catalyst, unlike the conventional coating compositions. When the anti-reflective coating composition includes a thermal acid generator (TAG), a crosslinking reaction may occur in a shorter period of time than in the conventional coating compositions, thereby preventing the anti-reflective coating layer from tearing.

The anti-reflective coating composition exhibits thermal fluidity due to heating during a curing process. A gap-filling property of the anti-reflective coating composition may be exhibited due to the thermal fluidity. Particularly, it is more effective because the anti-reflective coating composition exhibits thermal fluidity in a wider section as the starting point for crosslinking of the polymer in the anti-reflective coating composition increases. As a result, the gaps between the patterns may be more effectively filled. Generally, the anti-reflective coating composition according to one exemplary embodiment of the present invention has a higher starting point for the crosslinking than the conventional coating compositions, and thus may exhibit a very excellent gap-filling property. In particular, very narrow gaps (approximately 10 nm) which were not easy to fill with the conventional anti-reflective coating compositions are expected to be filled more easily with the composition according to one exemplary embodiment of the present invention.

Hereinafter, respective components of the anti-reflective coating composition will be described in further detail.

(a) Polymer

The polymer includes (a-1) at least one unit derived from a compound having an aromatic group and constituting the main chain of the polymer, and (a-2) a unit derived from a crosslinker and attached to the main chain. That is, the polymer may be a resin in which a crosslinker is allowed to react with a polymer, which is obtained by polymerizing a source monomer including a compound having an aromatic group, to attach the crosslinker to the main chain of the polymer.

Also, the polymer may further include (a-3) at least one unit derived from a compound having no aromatic group and constituting the main chain.

(a-1) Unit Derived from Compound Having Aromatic Group Constituting the Main Chain of Polymer The unit (a-1) is not particularly limited as long as it is derived from a polymerizable compound having an aromatic group. The aromatic group may act as a chromophoric group absorbing unwanted reflected rays when the photoresist composition layer is exposed to light.

The aromatic group may constitute the main chain (i.e., backbone) of the polymer, or may be included as a pendant group.

The aromatic group may be a monocyclic or polycyclic aryl or heteroaryl group exhibiting aromaticity, but the present invention is not particularly limited thereto. For example, the aromatic group may be at least one selected from the group consisting of a phenyl-based group, a naphthyl-based group, and an anthracenyl-based group.

The aromatic group may be properly selected according to the wavelengths of actinic radiation used to expose the photoresist composition layer to light. By way of example, when the photoresist composition layer is exposed to light with a wavelength of 248 nm, a naphthyl-based group, or an anthrancenyl-based group may be a desirable aromatic group. As another example, when the photoresist composition layer is exposed to light with a wavelength of 193 nm, a phenyl-based group or a naphthyl-based group may be a desirable aromatic group.

As still another example, the aromatic group may be a quinolinyl-based group.

In the unit (a-1), the compound having the aromatic group may contain a carboxyl group, or a hydroxyl group.

Specifically, the compound having the aromatic group may contain (i) at least two groups selected from the group consisting of carboxy, a carboxy ester, and a carboxy anhydride, or (ii) at least two hydroxyl groups.

Therefore, the units (a-1) may be linked via an ester bond. That is, the polymer may be a polyester-based polymer.

The polymer may include at least two units (a-1). That is, the polymer may be a polymer obtained by copolymerizing at least two monomers.

By way of example, the compound having the aromatic group may include aromatic dicarboxylic acids, aromatic dicarboxylic acid alkyl esters, aromatic carboxylic acid anhydrides, and the like.

Specific examples of the compound having the aromatic group may include dimethyl nitroterephthalate, dimethyl phthalate, dimethyl isophthalate, dimethyl 2,6-naphthalenedicarboxylate, dibutyl 2,6-naphthalenedicarboxylate, dimethyl terephthalate, dimethyl 5-nitroisophthalate, dimethyl 5-hydroxyisophthalate, thiophene-2,5-dicarboxylic acid, sulfoisophthalic acid, tetrafluorophthalic carboxylic acid, dimethyl 1,4-naphthalenedicarboxylate, dimethyl 2,3-naphthalenedicarboxylate, dimethyl 2,7-naphthalenedicarboxylate, dibutyl 1,4-naphthalenedicarboxylate, dibutyl 2,3-naphthalenedicarboxylate, dibutyl 2,7-naphthalenedicarboxylate, and the like.

As another example, the compound having the aromatic group may include an aromatic diol, an aromatic triol, an aromatic tetraol, and the like.

Specific examples of the aromatic diol may include benzopinacol; 1,1,4,4-tetraphenyl-1,4-butanediol; 3,4-bis(p-hydroxyphenol)-3,4-hexanediol; 1,2-benzenedimethanol; 1,4-benzenedimethanol; 2,3,5,6-tetramethyl-p-xylene-α,α'-diol; 2,4,5,6-tetrachlorobenzene-1,3-dimethanol; 2,3,5,6-tetrachlorobenzene-1,4-dimethanol; 2,2-diphenyl-1,3-propanediol; 3-(4-chlorophenoxy)-1,2-propanediol; 2,2'-(p-phenylenedioxy)-diethanol; 5-nitro-m-xylene-α,α'-diol; 1,8-bis(hydroxymethyl)naphthalene; 2,6-bis(hydroxymethyl)-p-cresol; O,O'-bis(2-hydroxyethyl)benzene; and the like.

Specific examples of the aromatic triol may include 1,2,4-trihydroxybenzene, 1,8,9-trihydroxyanthracene, and the like.

Specific examples of the aromatic tetraol may include tetrahydroxy-1,4-benzoquinone.

(a-2) Unit Derived from Crosslinker and Attached to Main Chain of Polymer

The unit (a-2) may be attached or grafted to the main chain of the polymer as a pendant group, for example, may be attached to the main chain of the polymer via a covalent bond.

The unit (a-2) is not particularly limited as long as it is a unit derived from a crosslinker.

By way of example, the unit (a-2) may be a unit derived from an amine-based crosslinker.

For example, glycoluril-based, melamine-based, urea-based, and benzoguanamine-based crosslinkers may be used as the amine-based crosslinker.

Among these, a glycoluril-based crosslinker is preferred, and specific examples of the glycoluril-based crosslinker may include tetramethoxymethyl glycoluril, tetrabutyl glycoluril, cyclohexyl glycoluril, isopropyl glycoluril, and the like.

Further, specific examples of the melamine-based crosslinker may include hexamethyloyl melamine.

For example, the crosslinker may be prepared by allowing an acrylamide or methacrylamide copolymer to react with formaldehyde in an alcohol-containing solvent, or optionally copolymerizing proper monomers other than the N-alkoxymethyl acrylamide or methacrylamide.

Such a crosslinker may be commercially available. For example, the glycoluril-based crosslinker is sold under the trade names Cymel 1170, 1171, and 1172 by American Cyanamid; the melamine-based crosslinker is sold under the trade names Cymel 300, 301, 303, 350, 370, 380, 1116, and 1130 by American Cyanamid; the urea-based crosslinker is sold under the trade names Powderlink 1174, 1196, Beetle 60, 65, and 80 by American Cyanamid; and the benzoguanamine-based crosslinker is sold under the trade names Cymel 1123 and 1125 by American Cyanamid.

(a-3) Unit Derived from Compound Having No Aromatic Group and Constituting Main Chain of Polymer The polymer may further include at least one unit derived from a compound having no aromatic group and constituting the main chain of the polymer, in addition to the unit (a-1).

In the unit (a-3), the compound having no aromatic group may contain a carboxyl group, or a hydroxyl group.

Specifically, the compound having no aromatic group main contain (i) at least two groups selected from the group consisting of carboxy, a carboxy ester, and a carboxy anhydride; or (ii) at least two hydroxyl groups.

By way of example, the unit (a-3) may include aliphatic/alicyclic dicarboxylates, aliphatic/alicyclic dicarboxylic acid alkyl esters, aliphatic/alicyclic carboxylic acid anhydrides, and the like.

For example, the unit (a-3) may be at least one unit derived from a compound represented by the following Formula 1 or 2:

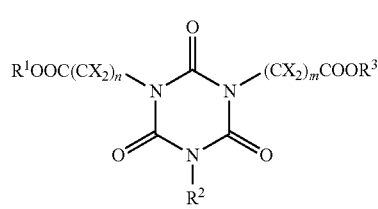

[Formula 1]

In Formula 1, at least two of $R^1OOC(CX_2)_n-$, $R^2-$, and $R^3OOC(CX_2)_m-$ represent different acids, or ester groups;

$R^1$, $R^2$, $R^3$ and X each independently represent hydrogen, or a non-hydrogen substituent, where the non-hydrogen substituent represents a substituted or unsubstituted $C_{1-10}$ alkyl group, a substituted or unsubstituted $C_{2-10}$ alkenyl or $C_{2-10}$ alkynyl group (for example, allyl, etc.), a substituted or unsubstituted $C_{1-10}$ alkanoyl group, a substituted or unsubstituted $C_{1-10}$ alkoxy group (for example, methoxy, propoxy, butoxy, etc.), an epoxy group, a substituted or unsubstituted $C_{1-10}$ alkylthio group, a substituted or unsubstituted $C_{1-10}$ alkylsulfinyl group, a substituted or unsubstituted $C_{1-10}$ alkylsulfonyl group, a substituted or unsubstituted carboxyl group, a substituted or unsubstituted $-COO-C_{1-8}$ alkyl group, a substituted or unsubstituted $C_{6-12}$ aryl group (for example, phenyl, naphthyl, etc.), or a substituted or unsubstituted 5- to 10-membered heteroalicyclic or heteroaryl group (for example, methylphthalimide, N-methyl-1,8-phthalimide, etc.); and n and m are the same as or different from each other, and each is an integer greater than 0.

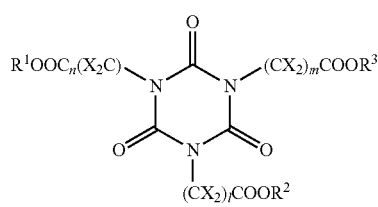

[Formula 2]

In Formula 2, $R^1OOC_n(X_2C)-$, $R^2OOC(CX_2)_l-$ and $R^3OOC(CX_2)_m-$ are all acids, or ester groups;

$R^1$, $R^2$, $R^3$ and X are as defined above in Formula 1; and n, l and m are the same as or different from each other, and each is an integer greater than 0.

As another example, the unit (a-3) may be, for example, at least one unit derived from an aliphatic/alicyclic diol, an aliphatic/alicyclic triol, or an aliphatic/alicyclic tetraol.

Specific examples of the aliphatic/alicyclic diol may include ethylene glycol; 1,3-propanediol; 1,2-propanediol; 2,2-dimethyl-1,3-propanediol; 2,2-diethyl-1,3-propanediol; 2-ethyl-3-methyl-1,3-propanediol; 2-methyl-2-propyl-1,3- propanediol; 2-butyl-2-ethyl-1,3-propanediol; 1,4-butanediol; 2-methyl-1,4-butanediol; 1,2-butanediol; 1,3-butanediol; 2,3-butanediol; 2,3-dimethyl-2,3-butanediol; 1,5-pentanediol; 1,2-pentanediol; 2,4-pentanediol; 2-methyl-2,4-pentanediol; 1,6-hexanediol; 2,5-hexanediol; 1,2-hexanediol; 1,5-hexanediol; 2-ethyl-1,3-hexanediol; 2,5-dimethyl-2,5-hexanediol; 1,7-heptanediol; 1,8-octanediol; 1,2-octanediol; 1,9-nonanediol; 1,10-decanediol; 1,2-decanediol; 1,12-dodecanediol; 1,2-dodecanediol; 1,2-tetradecanediol; 1,2-hexadecanediol; 1,16-hexadecanediol; 1,2-cyclobutanedimethanol; 1,4-cyclohexanedimethanol; 1,2-cyclohexanedimethanol; 5-norbornene-2,2-dimethanol; 3-cyclohexene-1,1-dimethanol; dicyclohexyl-4,4'-diol; 1,2-cyclopentanediol; 1,3-cyclopentanediol; 1,2-cyclooctanediol; 1,4-cyclooctanediol; 1,5-cyclooctanediol; 1,2-cyclohexanediol; 1,3-cyclohexanediol; 1,4-cyclohexanediol; 1,2-cycloheptanediol; 2,2,4,4-tetramethyl-1,3-cyclobutanediol; 1,2-cyclododecanediol; decahydronaphthalene-1,4-diol; decahydronaphthalene-1,5-diol; 3-chloro-1,2-propanediol; 1,4-dibromobutane-2,3-diol; 2,2,3,3-tetrafluoro-1,4-butanediol; diethylene glycol; triethylene glycol; tetraethylene glycol; pentaethylene glycol; dipropylene glycol; isosorbide; isomannide; 1,3-dioxane-5,5-dimethanol; 1,4-dioxane-2,3-diol; 1,4-diethane-2,5-diol; 1,2-dithiane-4,5-diol; 2-hydroxyethyldisulfide; 3,6-dithia-1,8-octanediol; 3,3'-thiodipropanol; 2,2'-thiodiethanol; 1,3-hydroxyacetone; 1,5-dihydroxy-2,2,4,4-tetrachloro-3-pentanone; glyceraldehyde; and the like.

Specific examples of the aliphatic/alicyclic triol may include glycerol; 1,1,1-tris(hydroxymethyl)ethane; 2-hydroxymethyl-1,3-propanediol; 2-ethyl-2-(hydroxymethyl)-1,3-propanediol; 2-hydroxymethyl-2-propyl-1,3-propanediol; 2-hydroxymethyl-1,4-butanediol; 2-hydroxyethyl-2-methyl-1,4-butanediol; 2-hydroxymethyl-2-propyl-1,4-butanediol; 2-ethyl-2-hydroxyethyl-1,4-butanediol; 1,2,3-butanetriol; 1,2,4-butanetriol; 3-(hydroxymethyl)-3-methyl-1,4-pentanediol; 1,2,5-pentanetriol; 1,3,5-pentanetriol; 1,2,3-trihydroxyhexane; 1,2,6-trihydroxyhexane; 2,5-dimethyl-1,2,6-hexanetriol; tris(hydroxymethyl)nitromethane; 2-methyl-2-nitro-1,3-propanediol; 2-bromo-2-nitro-1,3-propanediol; 1,2,4-cyclopentanetriol; 1,2,3-cyclopentanetriol; 1,3,5-cyclohexanetriol; 1,3,5-cyclohexanetrimethanol; 1,3,5-tris(2-hydroxyethyl)cyanuric acid; and the like, and specific examples of the aliphatic/alicyclic tetraol may include 1,2,3,4-butanetetrol; 2,2-bis(hydroxymethyl)-1,3-propanediol; 1,2,4,5-pentanetetrol; and the like.

The above-described polymer may be included at an amount of 80 to 99.99 wt %, for example, an amount of 95 to 99.99 wt %, based on the total weight of solid content in the anti-reflective coating composition.

(b) Solvent

The anti-reflective coating composition includes a solvent.

Specific examples of the solvent may include oxybutyric acid esters such as methyl 2-hydroxyisobutyrate, ethyl lactate, etc.; glycol ethers such as 2-methoxyethyl ether, ethylene glycol monomethyl ether, and propylene glycol monomethyl ether, etc.; ethers containing a hydroxyl group, such as methoxybutanol, ethoxybutanol, methoxypropanol, ethoxypropanol, etc.; esters such as methyl cellosolve acetate, ethyl cellosolve acetate, propylene glycol monomethyl ether acetate, dipropylene glycol monomethyl ether acetate; dibasic esters; propylene carbonates; γ-butyrolactones; and the like.

The solvent may be included in the composition such that the solid content in the anti-reflective coating composition is present in a concentration of 1 to 10 wt %. More specifically, the solvent may be included in the composition such that the solid content in the anti-reflective coating composition is present in a concentration of 2 to 5 wt %.

(c) Acid/Acid Generator

The anti-reflective coating composition according to one exemplary embodiment of the present invention may further include an acid and/or an acid generator.

Specific examples of the acid compound may include p-toluenesulfonic acid, dodecylbenzenesulfonic acid, oxalic acid, phthalic acid, phosphoric acid, camphorsulfonic acid, 2,4,6-trimethylbenzenesulfonic acid, triisonaphthalenesulfonic acid, 5-nitro-o-toluenesulfonic acid, 5-sulfosalicylic acid, 2,5-dimethylbenzylsulfonic acid, 2-nitrobenzenesulfonic acid, 3-chlorobenzenesulfonic acid, 3-bromobenzenesulfonic acid, 2-fluorocaprylsulfonic acid, 1-naphthol-5-sulfonic acid, 2-methoxy-4-hydroxy-5-benzoylbenzenesulfonic acid, and the like.

The acid generator may be a photoacid generator and/or a thermal acid generator.

For example, onium salt-based, nitrobenzyl-based, sulfonic acid ester-based, diazomethane-based, glyoxime-based, N-hydroxyimide sulfonic acid ester-based, and halotriazine-based photoacid generators may be used as the photoacid generator.

The onium salt-based photoacid generator may be a sulfonate, and a salt of sulfonium containing an aromatic group. Specific examples of the onium salt-based photoacid generator may include triphenylsulfonium trifluoromethanesulfonate, (p-t-butoxyphenyl)diphenylsulfonium trifluoromethanesulfonate, tris(p-t-butoxyphenyl)sulfonium trifluoromethanesulfonate, triphenylsulfonium p-toluenesulfonate, and the like. Specific examples of the nitrobenzyl-based photoacid generator may include 2-nitrobenzyl-p-toluenesulfonate, 2,6-dinitrobenzyl-p-toluenesulfonate, 2,4-dinitrobenzyl-p-toluenesulfonate, and the like. Specific examples of the sulfonic acid ester-based photoacid generator may include 1,2,3-tris(methanesulfonyloxy)benzene, 1,2,3-tris(trifluoromethanesulfonyloxy)benzene, 1,2,3-tris(p-toluenesulfonyloxy)benzene, and the like. Specific examples of the diazomethane-based photoacid generator may include bis(benzenesulfonyl)diazomethane, bis(p-toluenesulfonyl)diazomethane, and the like. Specific examples of the glyoxime-based photoacid generator may include bis-O-(p-toluenesulfonyl)-α-dimethylglyoxime, bis-O-(n-butanesulfonyl)-α-dimethylglyoxime, and the like. Specific examples of the N-hydroxyimide sulfonic acid ester-based photoacid generator may include N-hydroxysuccinimide methanesulfonic acid ester, N-hydroxysuccinimide trifluoromethanesulfonic acid ester, and the like. Specific examples of the halotriazine-based photoacid generator may include 2-(4-methoxyphenyl)-4,6-bis(trichloromethyl)-1,3,5-triazine, 2-(4-methoxynaphthyl)-4,6-bis(trichloromethyl)-1,3,5-triazine, and the like.

The photoacid generator may be included at an amount of 0.01 to 5 wt %, based on the total weight of solid content in the anti-reflective coating composition. More specifically, the content of the photoacid generator may be in a range of 0.05 to 1.5 wt %.

The thermal acid generator may serve to promote or enhance a crosslinking reaction during curing of a coating layer of the anti-reflective composition.

The thermal acid generator may be ionic, or substantially neutral.

By way of example, the thermal acid generator may be an arenesulfonic acid-based thermal acid generator, and more particularly a benzenesulfonic acid-based thermal acid generator.

Specific examples of the thermal acid generator may include cyclohexyl p-toluenesulfonate, methyl p-toluenesulfonate, cyclohexyl 2,4,6-triisopropylbenzene sulfonate, 2-nitrobenzyl tosylate, tris(2,3-dibromopropyl)-1,3,5-triazine-2,4,6-trione, alkyl esters of organic sulfonic acids and salts thereof, triethylamine salts of dodecylbenzenesulfonic acid, ammonium salts of p-toluenesulfonic acid, and mixtures thereof. Among these, ammonium salts of p-toluenesulfonic acid are preferred.

The thermal acid generator may be included at an amount of 0.01 to 1 wt %, based on the total weight of solid content in the anti-reflective coating composition. More specifically, the content of the thermal acid generator may be in a range of 0.05 to 0.2 wt %.

(d) Other Additives

The anti-reflective coating composition according to one exemplary embodiment of the present invention may further include a surfactant, a leveling agent, a dye compound, and the like as the other additives.

FC 171, FC 431, etc. commercially available from 3M Company may be used as the surfactant.

Silwet 7604, etc. commercially available from Union Carbide Corporation may be used as the leveling agent.

Also, the dye compound serves to absorb radiation used to expose the photoresist composition layer to light.

The respective additives may be included at an amount of 0.01 to 1 wt %, based on the total weight of solid content in the anti-reflective coating composition.

Method of Forming Photolithographic Pattern

A method of forming the photolithographic pattern according to one exemplary embodiment of the present invention includes (a) providing a substrate including one or more layers to be patterned on a surface of the substrate, (b) forming an anti-reflective coating layer from the anti-reflective coating composition of the present invention on the one or more layers to be patterned, (c) forming a layer of a photoresist composition on the anti-reflective coating layer, (d) exposing the photoresist composition layer to actinic radiation through mask patterns, and (e) forming a photoresist pattern by applying a developer onto the photoresist composition layer to remove a portion of the photoresist layer.

Types of the substrate are not particularly limited as long as they are used in a process using the photoresist composition layer. For example, silicon, silicon dioxide, gallium arsenide, silicon carbide, ceramic, quartz, and copper substrates may be used as the substrate. Also, a substrate used for applications of liquid crystal display devices or other flat panel display devices, for example, a glass substrate, a substrate coated with indium tin oxide, and the like may be used as the substrate. Also, a substrate for optical and optoelectronic devices (for example, waveguides) may be used as the substrate.

The anti-reflective coating composition according to one exemplary embodiment of the present invention is coated onto the substrate using a method such as spin coating, and the like. The anti-reflective coating composition may be coated onto the substrate to a dried thickness of 0.02 μm to 0.5 μm, preferably a dried thickness of 0.04 μm to 0.20 μm. A coated layer of the anti-reflective coating composition is preferably cured before a photoresist composition is applied onto the coated layer of the anti-reflective coating composition. In this case, the curing conditions may vary according to contents of the anti-reflective coating composition. In particular, the curing temperature may be regulated according to the type of acids and or acid generators included in the anti-reflective coating composition. For example, the curing may be performed at a temperature of 80° C. to 225° C. for 0.5 minutes to 40 minutes. The anti-reflective coating composition layer may not be dissolved in a photoresist solvent and an aqueous alkaline development solution by means of the curing.

A photoresist composition is applied onto the cured anti-reflective coating composition layer. The photoresist composition may be applied using a method such as spinning, dipping, meniscus coating, or roller coating. After the coating, the photoresist composition layer is dried by heating to remove a solvent, and thus becomes non-adhesive. Preferably, the anti-reflective coating composition layer and the photoresist composition layer should not be mixed together.

Next, the photoresist composition layer is exposed to actinic radiation through a mask. In this case, the photoresist composition layer is exposed to a sufficient amount of light to effectively activate photoactive components of the photoresist composition layer to provide a patterned image. The light exposure energy may, for example, be in a range of 3 to 300 mJ/cm$^2$, and may be adjusted according to a light exposure device, and the contents of the photoresist composition. The light-exposed photoresist composition layer may be baked to enhance a difference in solubility between a light-exposed region and an unexposed region. After the light exposure, the baking may, for example, be performed at a temperature of 50° C. or more, and more particularly a temperature of 50° C. to approximately 160° C.

Subsequently, the light-exposed photoresist composition layer is developed in a developer. By way of example, the developer may be an aqueous basic developer. Specific examples of the developer may include alkalis such as tetrabutyl ammonium hydroxide, sodium hydroxide, potassium hydroxide, sodium carbonate, sodium bicarbonate, sodium silicate, sodium metasilicate, aqueous ammonia, and the like. As another example, the developer may be an organic solvent developer. A development process may be performed by known methods under known conditions. The developed photoresist composition layer may be further cured by performing additional baking at a temperature of 100° C. to 150° C. for several minutes.

The developed substrate may have a substrate region from which a photoresist is removed, and the substrate region may be treated in a selective manner. For example, the substrate region from which the photoresist is removed may be chemically etched or plated using a method well known in the related art. A hydrofluoric acid etching solution, and a plasma gas etching agent such as an oxygen plasma etching agent may be used as an etching agent. For example, the anti-reflective coating composition layer may be removed and the substrate may be etched using the plasma gas etching agent.

Hereinafter, the present invention will be described in further detail with reference to Examples. However, it should be understood that the following Examples are given by way of illustration of the present invention only, and are not intended to limit the scope of the present invention.

Synthesis of Polymer Suitable for Anti-Reflective Coating Agent Applied to Photolithographic Process

Preparative Example

Synthesis of Polymers A-1 to A-3

Step 1: Synthesis of Polymers

A reaction setup was composed of a 250 mL three-necked round bottom flask, an agitator having heating and temperature-regulating functions, a temperature probe, a condenser, a dean-stark trap, and a nitrogen purge injection port. The monomer components listed in the following Table 1 were added to a reaction flask at the corresponding molar fractions until the sum of amounts of the monomers became 100 g. As a solvent, 100 g of anisole was further added to the reaction flask to prepare each reaction solution having a solid content of 50 wt %. As an acid catalyst, p-toluenesulfonic acid (PTSA) was added to the reaction solution at an amount listed in the following Table 1. Thereafter, the reaction solution was reacted by heating at a temperature and for a period of time presented in the following Table 1, thereby obtaining a polymer.

Step 2: Attachment of Crosslinker

A solution including approximately 100 g of the polymer obtained thus was heated at 50° C., and 20 g of methyl 2-hydroxyisobutyrate and 5 g of tetramethoxymethyl glycoluril (TMGU) were added thereto. The resulting mixture was reacted while being agitated at 50° C. for 3 hours, cooled at an ambient temperature, and then neutralized with triethylamine. As a result, the polymer in which TMGU was attached to the main chain via a covalent bond was obtained.

Step 3: Dilution and Precipitation

Subsequently, methyl 2-hydroxyisobutyrate (HBM) or tetrahydrofuran (THF) was added dropwise to the reaction solution until the reaction solution was diluted to an amount of 20 wt %, and the polymer was precipitated in a mixture of isopropanol (IPA) and methyl t-butyl ether (MTBE). Thereafter, the precipitate was filtered through a Buchner funnel to obtain a solid polymer, and the solid polymer was air-dried, and then dried at 40 to 50° C. under a vacuum.

The respective polymers A-1 to A-3 obtained thus were analyzed by means of $^{13}$C-nuclear magnetic resonance (NMR). As a result, it was revealed that the crosslinker was attached to the main chain of the polymer at an amount of approximately 10 wt %.

Among these, a repeating unit of the polymer A-2 had the following structure:

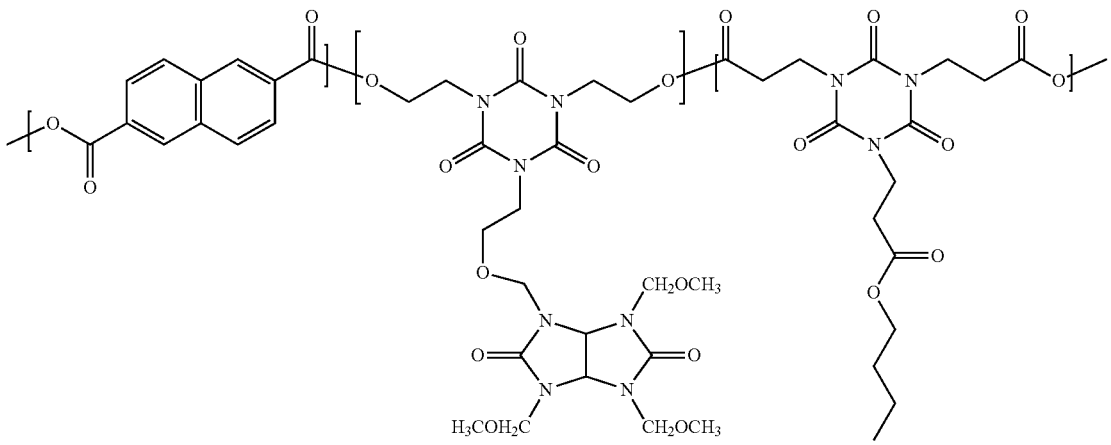

Comparative Preparative Example

Synthesis of Polymers A-4 to A-6

The above-described monomer components listed in the following Table 1 were each added to a reaction flask at the corresponding molar fractions until the sum of amounts of the monomers became 100 g, and polymers A-4 to A-6 were obtained by performing the same procedures as described above in the synthesis process of the polymers A-1 to A-3, except that Step 3 was performed immediately after Step 1 without performing Step 2.

Among these, a repeating unit of the polymer A-5 had the following structure:

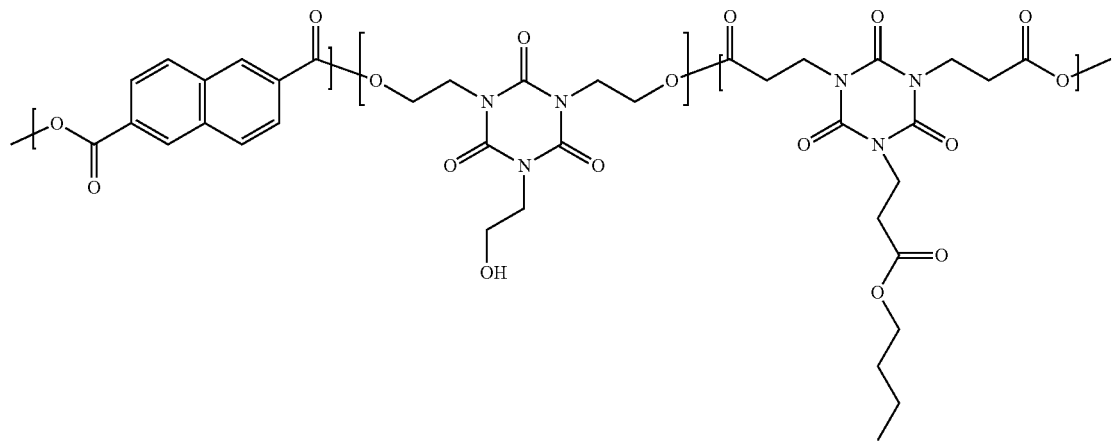

The composition of Preparative Examples and Comparative Preparative Examples are summarized in the following Table 1.

mixture to prepare a composition. Thereafter, the composition was filtered through a 0.45 μm filter made of polytetrafluorethylene (PTFE).

TABLE 1

| Polymer | Monomer content of polymer (mol %) Total of 100 g | | | | | | | Acid catalyst (mmol) PTSA | Polymerization reaction | | Cross-linker (g) TMGU | Additional reaction | | Final polymer M.W. |
|---|---|---|---|---|---|---|---|---|---|---|---|---|---|---|
| | THEIC | TCEIC | Butanol | DNDC | DMT | HIBA | DHIP | | Temp. (° C.) | Time (h) | | Temp. (° C.) | Time (h) | |
| A-1 | 35 | — | — | — | 20 | 30 | 15 | 4.8 | 150 | 12 | 5 | 50 | 3 | 3,650 |
| A-2 | 62 | 13 | Excess | 25 | — | — | — | 6.8 | 150~155 | 5 | 5 | 50 | 3 | 3,000 |
| A-3 | 53 | — | — | — | 47 | — | — | 1.4 | 150 | 8 | 5 | 50 | 3 | 10,000 |
| A-4 | 35 | — | — | — | 20 | 30 | 15 | 4.8 | 150 | 12 | — | — | — | 2,350 |
| A-5 | 62 | 13 | Excess | 25 | — | — | — | 6.8 | 150~155 | 5 | — | — | — | 3,000 |
| A-6 | 53 | — | — | — | 47 | — | — | 1.4 | 150 | 8 | — | — | — | 3,000 |

THEIC: tris(2-hydroxyethyl) isocyanurate
TCEIC: tris(2-carboxyethyl) isocyanurate
DNDC: dimethyl 2,6-naphthalenedicarboxylate
DMT: dimethyl terephthalate
HIBA: 2-hydroxyisobutyric acid
PTSA: p-toluenesulfonic acid
DHIP: dimethyl 5-hydroxyisophthalate
TMGU: tetramethoxymethyl glycoluril Preparation of Bottom Anti-Reflective Composition The following materials were used in Examples and Comparative Examples below.

(A-1) to (A-6) Polymers: polymers prepared as described above were used.

(B-1) Acid catalyst (thermal acid generator): ammonium p-toluenesulfonate.

(C-1) Crosslinker (thermal crosslinker): tetramethoxymethyl glycoluril.

(D-1) Surfactant: Polyfox™ 656 (Omnova Solutions Inc.).

(E-1) Solvent: methyl 2-hydroxyisobutyrate.

Example 1

370 mg of the polymer (A-1), 0.4 mg of the acid catalyst (B-1), 20 mg of the crosslinker (C-1), and 0.2 mg of the surfactant (D-1) were mixed based on the solid content, and 9.6 g of the solvent (E-1) was mixed with the resulting mixture to prepare a composition. Thereafter, the composition was filtered through a 0.45 μm filter made of polytetrafluorethylene (PTFE).

Example 2

390 mg of the polymer (A-2), and 0.2 mg of the surfactant (D-1) were mixed based on the solid content, and 9.6 g of the solvent (E-1) was mixed with the resulting mixture to prepare a composition. Thereafter, the composition was filtered through a 0.45 μm PTFE filter.

Example 3

370 mg of the polymer (A-3), 0.4 mg of the acid catalyst (B-1), 20 mg of the crosslinker (C-1), and 0.2 mg of the surfactant (D-1) were mixed based on the solid content, and 9.6 g of the solvent (E-1) was mixed with the resulting mixture to prepare a composition. Thereafter, the composition was filtered through a 0.45 μm PTFE filter.

Comparative Example 1

340 mg of the polymer (A-4), 0.4 mg of the acid catalyst (B-1), 60 mg of the crosslinker (C-1), and 0.2 mg of the surfactant (D-1) were mixed based on the solid content, and 9.56 g of the solvent (E-1) was mixed with the resulting mixture to prepare a composition. Thereafter, the composition was filtered through a 0.45 μm PTFE filter.

Comparative Example 2

340 mg of the polymer (A-5), 0.4 mg of the acid catalyst (B-1), 60 mg of the crosslinker (C-1), and 0.2 mg of the surfactant (D-1) were mixed based on the solid content, and 9.56 g of the solvent (E-1) was mixed with the resulting mixture to prepare a composition. Thereafter, the composition was filtered through a 0.45 μm PTFE filter.

Comparative Example 3

340 mg of the polymer (A-6), 0.4 mg of the acid catalyst (B-1), 60 mg of the crosslinker (C-1), and 0.2 mg of the surfactant (D-1) were mixed based on the solid content, and 9.56 g of the solvent (E-1) was mixed with the resulting mixture to prepare a composition. Thereafter, the composition was filtered through a 0.45 μm PTFE filter.

The compositions of Examples and Comparative Examples are summarized in the following Table 2.

TABLE 2

| | Major blended components of bottom anti-reflective compositions | | | |
|---|---|---|---|---|
| Items | Polymer | Acid catalyst | Crosslinker | Surfactant |
| Example 1 | A-1 | B-1 | C-1 (20 mg) | D-1 |
| Example 2 | A-2 | — | — | D-1 |
| Example 3 | A-3 | B-1 | C-1 (20 mg) | D-1 |
| Comparative Example 1 | A-4 | B-1 | C-1 (60 mg) | D-1 |
| Comparative Example 2 | A-5 | B-1 | C-1 (60 mg) | D-1 |
| Comparative Example 3 | A-6 | B-1 | C-1 (60 mg) | D-1 |

Evaluation of Bottom Anti-Reflective Composition

Experimental Example 1

Measurement of Solvent Resistance

A composition to be tested was spin-coated on a silicon wafer, and heat-treated at 205° C. or 215° C. for one minute. The thickness of the wafer was measured using ellipsometry, and a mixed solvent of propylene glycol monomethyl ether acetate (PGMEA) and methyl 2-hydroxyisobutyrate as a typical solvent for photoresists was poured on a surface of the wafer, and left for one minute to be fixed in the surface of the wafer. Thereafter, the wafer was spin-dried at 4,000 rpm for 60 seconds, and the thickness of the wafer was measured again. Then, a difference in thickness (i.e., film loss) was calculated.

Experimental Example 2

Measurement of Optical Parameters

A composition to be tested was spin-coated on a silicon wafer, and heat-treated at 205° C. or 215° C. for one minute. The real reflective index (n) and the imaginary reflective index (k) of the composition were measured using ellipsometry.

Experimental Example 3

Measurement of Content of Residual Crosslinker in Composition

The contents of the residual crosslinkers in the compositions prepared in Examples and Comparative Examples were measured using liquid chromatography-mass spectroscopy (LC-MS). First, 0.001 to 20 wt % of TMGU solutions were prepared, and the content of the crosslinker was measured by LC-MS to plot an area ratio calibration curve for the content of the crosslinker using mass spectroscopy (MS). Thereafter, the compositions of Examples 1 to 3 were measured by LC-MS, and the content of the residual crosslinker was calculated from an area of the corresponding peak of the TMGU compound using the calibration curve.

The results of Experimental Examples 1 to 3 are summarized in the following Table 3.

TABLE 3

| Items | Content of residual crosslinker in composition[1] | Solvent resistance (film loss) | Tg of polymer (° C.) | n/k @ 248 nm |
|---|---|---|---|---|
| Example 1 | 5 wt % | <0.5% | 70 | 1.74/0.12 |
| Example 2 | 0.001 wt % | <0.5% | 50 | 1.73/0.18 |
| Example 3 | 5 wt % | <0.5% | 56 | 1.74/0.2 |
| Comparative Example 1 | 15 wt % | <0.5% | 68 | 1.74/0.12 |
| Comparative Example 2 | 15 wt % | <0.5% | 50 | 1.73/0.18 |
| Comparative Example 3 | 15 wt % | <0.5% | 63 | 1.74/0.2 |

[1]Based on the total weight of solid content in the composition

Experimental Example 4

Evaluation of Coatability on Pattern

Figure 1B:
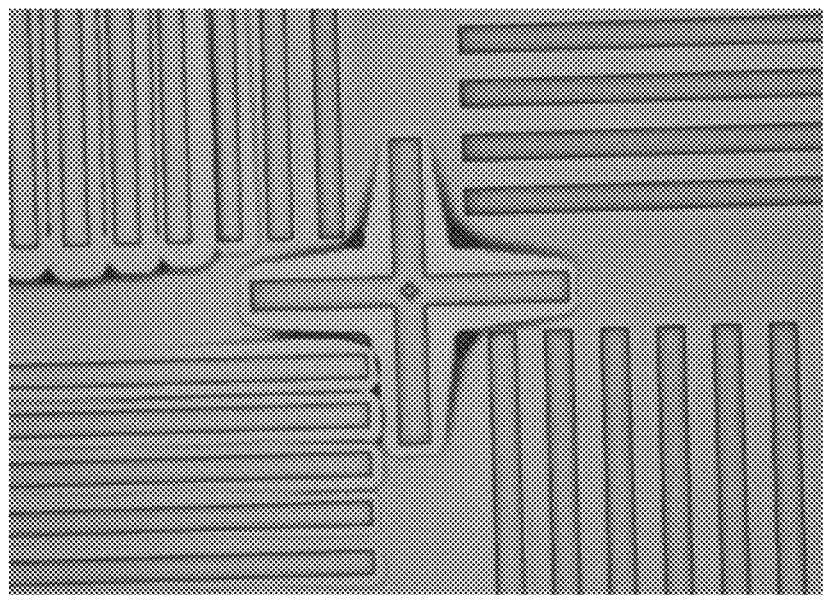

The compositions prepared in Example 2 and Comparative Example 2 were spin-coated on silicon wafers to which patterns having a line interval of several hundred nm to several μm were transferred, and heat-treated at 205° C. or 215° C. for one minute. Thereafter, the coating stability and filling properties of the compositions on the patterns were observed under an optical microscope, or a scanning electron microscope. FIGS. 1A and 1B show microscope images of patterns coated with the compositions of Example 2 and Comparative Example 2. As shown in FIGS. 1A and 1B, it was revealed that a coating film of the composition of Example 2 was coated well to correspond to the patterns, but a pull-back phenomenon in which a coating film of the composition of Comparative Example 2 tore during a heat curing process occurred. The compositions of Example 2 and Comparative Example 2 had substantially the same characteristics as the other anti-reflective coating films.

Experimental Example 5

Measurement of Heat Curing Initiation Temperature of Films

Figure 2A:
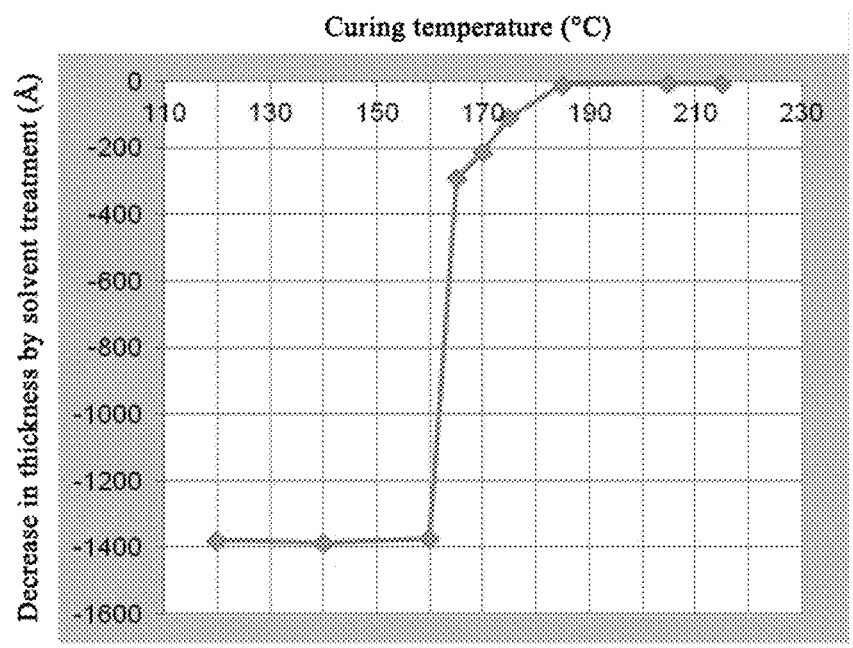
FIGS. 2A and 2B are graphs plotted for changes in thicknesses by solvent treatment according to curing temperatures of films coated with the compositions of Example 2 and Comparative Example 2, respectively.
Figure 2B:
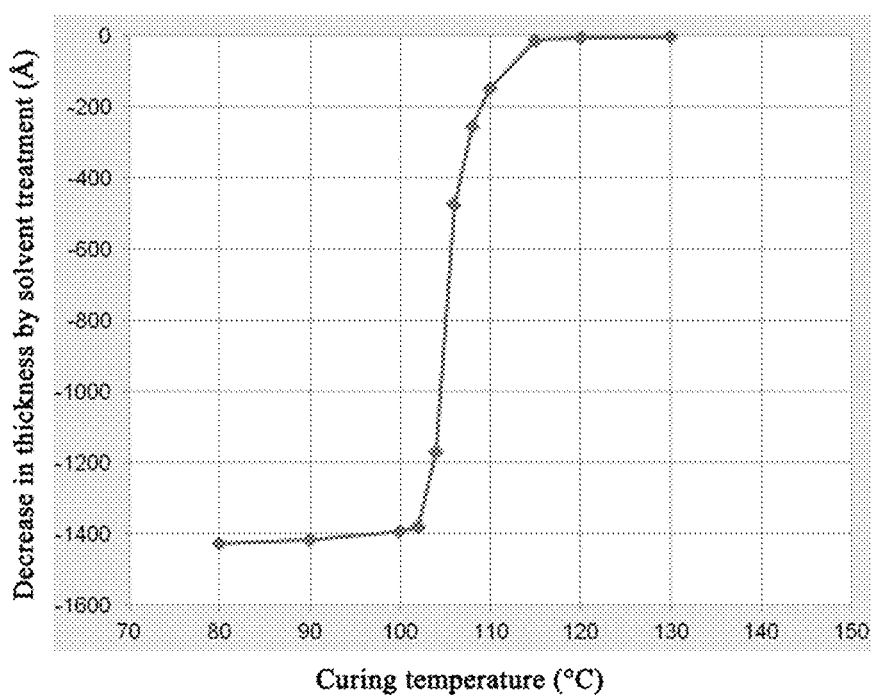

The compositions prepared in Example 2 and Comparative Example 2, respectively were spin-coated on wafers, heat-treated at a temperature of 50° C. to 215° C. for one minute, and measured for a change in thickness using a method of measuring the solvent resistance. FIGS. 2A and 2B are graphs plotted for changes in thicknesses of the compositions of Example 2 and Comparative Example 2, respectively. As shown in FIGS. 2A and 2B, it could be seen that the composition of Example 2 started to be cured at approximately 160° C., while the composition of Comparative Example 2 started to be cured at approximately 100° C., which was a much lower temperature than that of the composition of Example 2. The results indicated that the composition of Example 2 exhibited thermal fluidity up to approximately 160° C., while the composition of Comparative Example 2 exhibited thermal fluidity up to approximately 100° C. and exhibited no thermal fluidity at 100° C. or higher. Considering that both of the glass transition temperatures (Tg) of the polymers in the compositions of Example 2 and Comparative Example 2 were approximately 50° C., a difference between the curing temperature and the glass transition temperature (Tg) of the composition of Example 2 was approximately 110° C., indicating that the thermal fluidity of the film in a heat curing process, which was one of the major factors for the filling property, was improved.

Experimental Example 6

Evaluation of Gap-Filling Property of Pattern

Figure 3A:
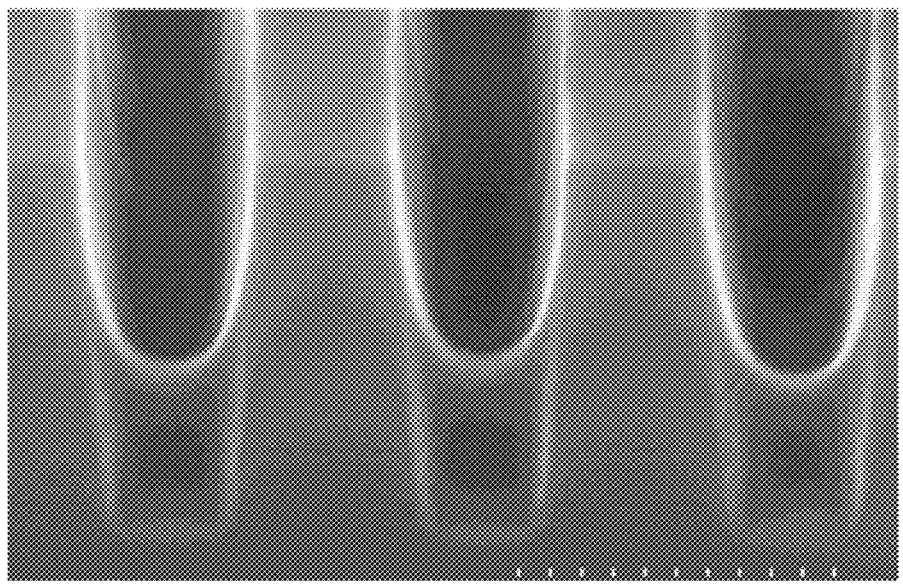
FIGS. 3A and 3B are microscope images of patterns having gaps of 150 nm and 300 nm, respectively, which are coated with the composition of Example 2.
Figure 3B:
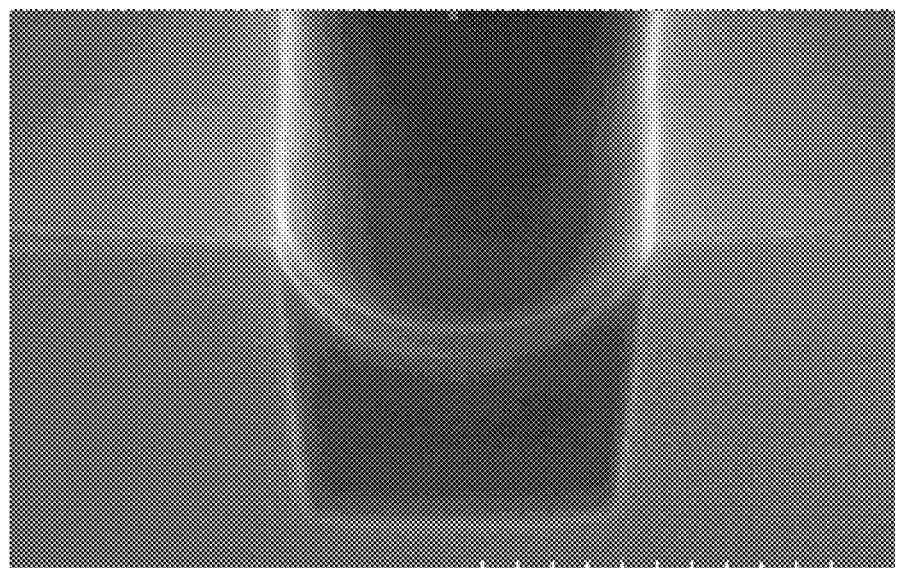

The composition prepared in Example 2 was spin-coated on patterns at a nanometer level to evaluate a gap-filling property. FIGS. 3A and 3B are microscope images of patterns having gaps of 150 nm and 300 nm, respectively which are coated with the composition of Example 2. As shown in FIGS. 3A and 3B, it could be seen that the gaps at a nanometer level were filled with the composition of Example 2 with no void.

It will be apparent to those skilled in the art that various modifications can be made to the above-described exemplary embodiments of the present invention without departing from the scope of the invention. Thus, it is intended that the present invention cover all such modifications provided they come within the scope of the appended claims and their equivalents.

What is claimed is:

1. A method of forming a photolithographic pattern, comprising:
   (a) providing an antireflective composition obtained by steps comprising admixing materials comprising:
      1) a polymer comprising:
         (i) (a-1) at least one unit derived from a compound having an aromatic group and constituting the main chain of the polymer; and
         (ii) (a-2) a unit derived from an amine crosslinker and attached to the main chain,
      2) a crosslinker not attached to the polymer, wherein the content of the crosslinker not attached to the polymer is from 0.001 wt % to 5 wt % based on the total weight of solid content in the anti-reflective composition, and
      3) a solvent;
   (b) applying a coating layer of the anti-reflective composition on a substrate;
   (c) applying a layer of a photoresist composition over the anti-reflective composition layer;
   (d) exposing the photoresist composition layer to actinic radiation; and
   (e) developing the photoresist composition layer to form a photoresist pattern.

2. The method of claim 1 wherein the unit (a-2) is derived from a glycoluril crosslinker.

3. The method of claim 1 wherein the aromatic group comprises a phenyl group, naphthyl group or anthracenyl group.

4. The method of claim 1 wherein the polymer further comprises at least one unit derived from a compound having no aromatic group and constituting the main chain.

5. The method of claim 1 wherein the anti-reflective composition further comprises an acid.

6. The method of claim 5 wherein the anti-reflective composition further comprises an acid generator.

7. The method of claim 1 wherein the anti-reflective composition further comprises an acid generator.

8. The method of claim 1 wherein the content of the crosslinker not attached to the main chain of the polymer is less than or equal to 3 wt % based on the total weight of solid content in the composition.

9. A method of forming a photolithographic pattern, comprising:
   (a) preparing an antireflective composition by one or more steps comprising:
      (i) admixing distinct materials comprising:
         1) a polymer comprising (a-1) at least one unit derived from a compound having an aromatic group and constituting the main chain of the polymer, and
         (a-2) a unit derived from an amine crosslinker and attached to the main chain,
         2) a crosslinker not attached to the polymer, wherein the content of the crosslinker not attached to the polymer is from 0.001 wt % to 5 wt % based on the total weight of solid content in the anti-reflective composition, and
         3) a solvent;
   (b) applying a coating layer of the anti-reflective composition on a substrate;
   (c) applying a layer of a photoresist composition over the anti-reflective composition layer;
   (d) exposing the photoresist composition layer to actinic radiation; and
   (e) developing the photoresist composition layer to form a photoresist pattern.

10. The method of claim 9 wherein the content of the crosslinker not attached to the main chain of the polymer is less than or equal to 3 wt % based on the total weight of solid content in the composition.

* * * * *